United States Patent [19]

Garver

[11] 4,387,386

[45] Jun. 7, 1983

[54] MICROWAVE CONTROLLED FIELD EFFECT SWITCHING DEVICE

[75] Inventor: Robert V. Garver, Boyds, Md.

[73] Assignee: The United States of America as represented by the Secretary of the Army, Washington, D.C.

[21] Appl. No.: 157,758

[22] Filed: Jun. 9, 1980

[51] Int. Cl.³ .................... H01L 29/80; H01L 29/78
[52] U.S. Cl. ........................................ 357/22; 357/23; 333/247; 333/81 R
[58] Field of Search ............... 357/22, 23, 55; 333/81, 333/247

[56] References Cited

U.S. PATENT DOCUMENTS

| | | | |
|---|---|---|---|
| 3,975,752 | 8/1976 | Nicolay | 357/22 |
| 4,173,764 | 11/1979 | de Cremoux | 357/22 |
| 4,196,439 | 4/1980 | Niehaus | 357/22 |
| 4,222,164 | 9/1980 | Triebwasser | 357/22 |
| 4,284,999 | 8/1981 | Iwanami | 357/22 |
| 4,300,148 | 11/1981 | Niehaus et al. | 357/22 |
| 4,325,073 | 4/1982 | Hughes | 357/22 |
| 4,333,224 | 6/1982 | Buchanan | 357/22 |
| 4,336,549 | 6/1982 | Ladd | 357/22 |

*Primary Examiner*—Andrew J. James
*Attorney, Agent, or Firm*—Nathan Edelberg; Robert P. Gibson; Saul Elbaum

[57] ABSTRACT

A microwave switching device replacing PIN diodes and operating at higher speeds requires reduced switching current. A field effect controlled device is utilized with no ground plane, for elimination of source-ground and drain-ground capacitance. Massive source and drain structures reduce terminal inductance. A low resistance active region provides dynamic switching capability improving over prior art devices in operating frequencies and speeds.

8 Claims, 4 Drawing Figures

MICROWAVE CONTROLLED FIELD EFFECT SWITCHING DEVICE

RIGHTS OF THE GOVERNMENT

The invention described herein may be manufactured, used, and licensed by or for the United States Government for governmental purposes without the payment to me of any royalty thereon.

BACKGROUND OF THE INVENTION

1. Field of the Invention

The present invention pertains to microwave switching devices, and more particularly to controlled switching devices utilizing novel field-effect devices to provide such switching.

2. Description of the Prior Art

Prior art devices typically use PIN diodes for switching at microwave frequencies. Such use is documented in *Microwave Diode Control Devices*, R. V. Garver, published by Artech House, Inc., Dedham, MA., 1976 and incorporated herein by reference.

The use of such PIN diodes, however, is typically associated with several disadvantages, including a long switching transition time delay caused by the thickness of the intrinsic layer, typically in the range of 1–10 microns. Additionally, biasing of such diodes requires the application of a bias current to the device being switched in order to maintain the diode in its conductive state, and the application of a reverse biasing voltage to keep the diode nonconducting, as required.

Because of the widespread application of such microwave diode control devices to new systems and their inclusion in integrated circuits, improved performance of the devices is widely sought. A comprehensive bibliography of development and application of microwave field-effect-transistors (FET's) is provided in Liechti, "Microwave Field-Effect Transistors", *I.E.E.E. Trans. Microwave Theory Tech.*, vol. MTT-24, pp. 279–300, 1976. The reference includes a summary of microwave FET operation, but does not include a device as disclosed herein.

Dobratz et al disclose the connection of a conventional MOSFET to a circulator at 4–8 GHz to provide 180° phase shift in "Gigabit-Rate GaAs FET RF Phase Modulators", 1978 *I.E.E.E. Int. Solid-State Circuits Conf., Dig. Tech. Papers*, pp. 76–77. While the phase shifter demonstrates high speed and efficient modulation, the insertion loss is higher than desired, exceeding 1 dB. Dual gate MOSFET's have demonstrated 60 dB dynamic switching range and high speed at 4–8 GHz, as disclosed by Goel et al, "A 4–8 GHz Dual Gate Amplifier", 1978 *I.E.E.E. Int. Solid-State Circuits Conf., Dig. Tech. Papers*, pp. 126–127.

Where FET devices are used as amplifiers, particularly at high input power levels, current limiting is observed when the source-to-drain voltage approximately equals the gate voltage. This mechanism leads to limitation of the power output of microwave amplifiers.

Fukuda et al optimize an amplifier to provide such limiter operation at 10 GHz. Such limiting is desirable in several phase modulated systems in order to reduce amplitude modulation on the carrier. 1977 *I.E.E.E. Int. Microwave Symp. Dig. Tech. Papers*, pp. 240–242.

SUMMARY AND OBJECTS OF THE INVENTION

It is accordingly an object of the present invention to provide a microwave controlled switching device improving over the limitations of the prior art.

It is a more specific object of the invention to provide a microwave switching device having faster switching times than previously available with PIN diodes.

It is yet another object of the invention to eliminate the large capacitance typically found in prior art FET devices between the source and substrate and between the drain and substrate.

It is still another object of the invention to eliminate parasitic inductance associated with prior art FET devices.

It is a further object of the invention to provide a direct replacement for microwave diode switches in applications such as phased array radars.

Another object of the invention is the elimination of biasing signals needed for use of diode switches in microwave transmission lines and waveguides.

Still another object of the invention is the elimination of a ground plane found in prior art FET devices.

The present invention accordingly provides a novel FET structure for use in microwave switching applications, for example as a direct replacement for prior art diode switches. The inventive device includes a layer of doped semiconductor adjacent a substantially intrinsic semiconductor, thus eliminating a ground plane typically found in the prior art. The present device further includes a pair of controlled terminals connected to the layer of doped semiconductor, forming source and drain terminals for conducting current switched thereby. A control terminal is connected to the layer of doped semiconductor, between the controlled terminals, for controlling the density of the majority carriers in a portion of the layer between the controlled terminals. The control terminal forms a gate of the resultant device, and the portion of the layer forms the active region between the source and drain, having a variably depleted or doped concentration of majority carriers.

A control voltage may be connected to the gate terminal for controlling the depletion of majority carriers in the active region. The source and drain electrodes may be DC grounded in a typical waveguide application of the device.

In still other applications of the device, the source and drain electrodes may be connected in series with a center conductor of a transmission line, or in shunt between a center conductor and an outer conductor of the transmission line. Alternatively, the controlled terminals may be connected in shunt with a waveguide at a maximum point of the electric field therein.

The inventive device is typically doped with a donor material to provide a concentration of N-type majority carriers in its active region, the doping concentration providing a low resistance active region.

The inventive device is provided with massive source and drain structures in order to eliminate inductance typically associated therewith. The structures may have dimensions providing an area of 400 square mils, or approximately $250 \times 10^{-9}$ m$^2$, although structures with areas in the range of $60-$ to $500 \times 10^{-9}$ m$^2$ are contemplated.

Some further applications of the device include its use in Chebyshev filters, or in an isolation device utilizing a plurality of devices spaced apart by one-quarter wavelength.

BRIEF DESCRIPTION OF THE DRAWING

The foregoing features, object and advantages of the present invention will become more readily apparent from the following specification and appended claims when considered in conjunction with the accompanying drawing wherein:

DETAILED DESCRIPTION OF A PREFERRED EMBODIMENT

Figure 1:
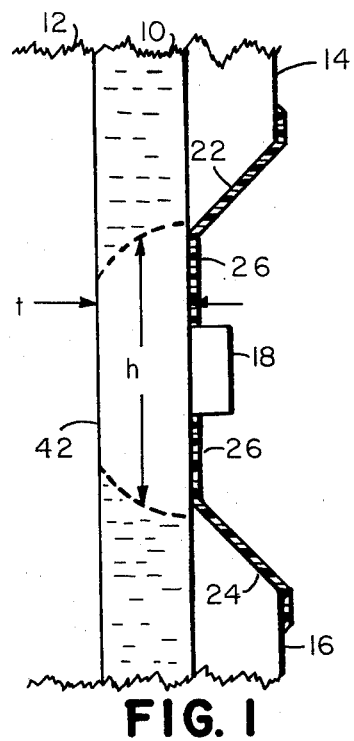
FIG. 1 illustrates the inventive device, in cross section.

In accordance with the present invention, a FET for a microwave control device is illustrated in FIG. 1. As shown therein, a layer of doped semiconductor 10 is formed adjacent to intrinsic semiconductor 12. The doped layer may be epitaxially grown on the intrinsic semiconductor, and may be formed of GaAs with a thickness of approximately 1 μm, at a donor concentration $N_D$ which may be $10^{17}$ ions/cm$^3$, although values of $N_D$ in the range $10^{15}$ to $10^{18}$ are contemplated.

A source 14, and drain 16 are provided for the layer 10, and a gate terminal 18 disposed therebetween. Unlike typical structures, the present device includes intrinsic semiconductor 12 instead of a doped semiconductor, thus eliminating the capacitor-like structure of the prior art and the resultant source-substrate and drain-substrate capacitance.

For operation of the device in embodiments wherein the source and drain are grounded, the source and drain structures are provided with sloping faces 22 and 24, respectively, in order to prevent arcing between those structures and the gate. Further, an insulator layer of high dielectric strength, shown at 26, for further reducing the possibility of arcing, is provided between the gate and controlled terminals. Insulator layer 26 is particularly shown as covering the sloping faces of the source and drain, as well as covering the active region subject to control by the gate.

Figure 2:
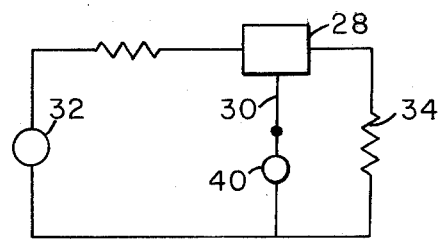
FIG. 2 shows one application of the inventive device.

A typical application of the present device is shown in FIG. 2, wherein a FET 28 is connected in series with a center conductor of a transmission line. By application of an appropriate voltage to terminal 30, connected to gate 18, the region under the gate can be depleted of majority carriers, and the FET made to appear as an open circuit between its source and drain terminals, thus causing reflection of the power incident on the device back to the input end of the line, at source 32. By changing the voltage applied to terminal 30, the active region of the FET may again be made conductive. In the ideal situation, the source-to-drain impedance would approximate a short circuit, thus causing transmission of the incident power from source 32 to load 34. With the exception of the application of a control voltage to terminal 30 of the FET, the device is seen to be a direct replacement of a diode similarly connected in a transmission line. Such a diode connection, as well as a shunt connection between the center and outer conductors, is shown in Garver, supra, at FIGS. 2-4.

Figure 3:
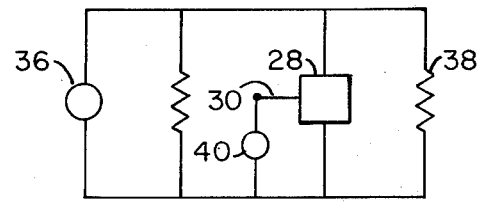
FIG. 3 shows another application of the device.

FIG. 3 shows the present device connected in shunt between the center and outer conductors of a transmission line between a source 36 and load 38. As seen in both FIGS. 2 and 3, the transmission line is separated from the control voltage, shown at 40, applied to terminal 30 for controlling conductivity of the FET. Thus, unlike the prior art usage of PIN diodes, the transmission circuit is not responsible for conducting forward biasing current or reverse biasing voltage for the controlled switch.

Alternatively, the source and drain might be similarly connected in shunt with a waveguide, not shown, at the maximum point of the electric (e−) field.

The following examples illustrate various parameters and performance figures achievable with the present device.

For a control device, both the source and the drain are grounded, and the control voltage is applied to the gate. For deriving order-of-magnitude device parameters, parasitic elements normally associated with a FET will be ignored. Further, it is recognized that while a donor doping concentration is preferred, doping with acceptor materials is possible.

The control FET illustrated in FIG. 1 is for a depletion mode rather than an enhancement mode device as used in microwave FET amplifiers. Normally, the active region 42 of a depletion mode FET is filled with free majority carriers $N_D$, giving the active region a resistivity $\rho$. The resistance R of the active region is given by $$R = \rho \frac{h}{A} \quad (1)$$

where h is the effective height and A is its area (the thickness of the epitaxial layer times gate width w distance perpendicular to the plane of FIG. 1). By using parameters of $N_D = 10^{17}$, h=3 μm, t=1 μm, and w=500 μm, along with $\rho = 2 \times 10^{-2}$ for GaAs, R is found to be 1.2 ohm.

Upon application of sufficient negative voltage to the gate, the free electrons in the active region are repelled to the edges of the zone defined by h and create a depletion region which has a capacitance C, given by $$C = \frac{\epsilon A}{h} \approx \frac{8A}{h} pF \quad (2)$$

(dimensions in cm) in which $\epsilon$ is the dielectric constant. For the dimensions given, the capacitance is 0.13 pF.

The attenuation $\alpha$ of a shunt device is given by $$\alpha = 10 \log\left[\left(\frac{G}{2Y_o} + 1\right)^2 + \left(\frac{B}{2Y_o}\right)^2\right] \quad (3)$$

in which the admittance of the device is G+jB, and it is shunting a transmission line of characteristic admittance $Y_o$. See Garver, supra. A similar equation may be obtained for the series connection.

Thus, a 1.2 ohm device shunting a 50-ohm transmission line will provide 27 dB isolation. Three 1.2 ohm devices, spaced a quarter wavelength apart, will provide more than 90 dB isolation (27 dB for each device and an additional 6 dB each provided by the second and third devices).

When the 0.13 pF capacitance is built into a seven-element Chebyshev filter as the second, fourth, and sixth elements, the filter provides a minimum VSWR of 1.1 up to a bandwidth Δw satisfying $$\frac{\Delta wC}{Y_o} = 1.5 \quad (4)$$

or 40 GHz.

In order to determine the magnitude of voltage required on the gate to sweep out 1-2 μm into the epitaxial layer, the insulator is assumed to be thin, and the doping profile is accurately represented as a step. The length of the depletion region of an abrupt junction $L_D$ is given by $$L_D = \sqrt{\frac{2\epsilon}{qN_D}} \sqrt{V} \quad (5)$$

in which $\epsilon = \epsilon_r\epsilon_o = (12.5)(8.854\times 10^{-14} \text{F/cm})$ for GaAs, $q = 1.6\times 10^{-19}$ C, and V is negative applied voltage. For $N_D = 10^{17}$, 288 V is required for 2 μm and 72 V is required for 1 μm.

The foregoing example shows that an FET optimized for control in accordance with the present invention provides significant performance.

The general capability of the present structure can be derived by using a cutoff frequency $f'_c$ defined as $$f'_c = \frac{1}{2\pi RC} \quad (6)$$

The FET structure is similar to that of a PIN diode in that R and C are not present at the same time. Either one of the other is present. In practice, some parasitic resistance is present with C, but is typically smaller than R. In the preceeding equation the cutoff frequency symbol is primed to avoid confusion with cutoff frequency normally associated with varactor and PIN diodes.

From equations (1), (2), and (6), $$f'_c = 20/\rho \text{ GHz}. \quad (7)$$

Figure 4:
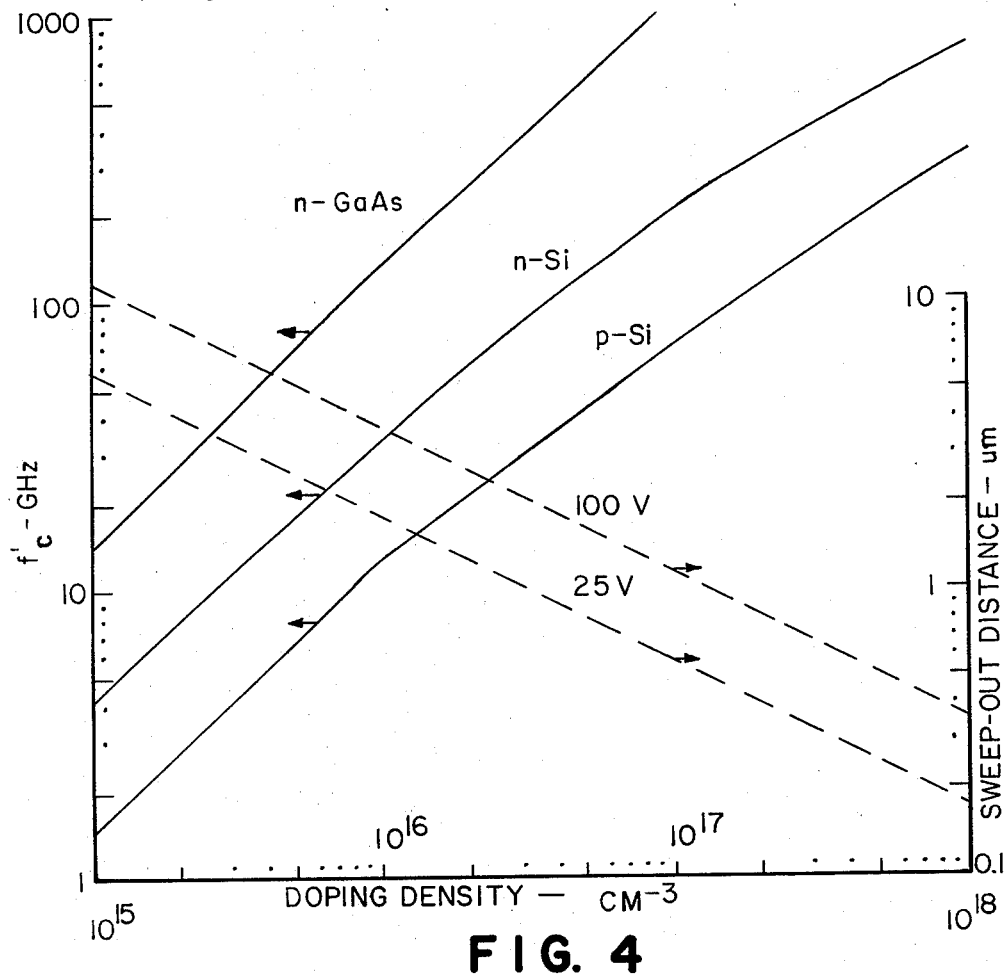
FIG. 4 shows a Figure of Merit for the device, and sweepout distances therefor, in graphical form.

The curves of $f'_c$ shown in FIG. 4 were derived from data in Sze, *Physics of Semiconductor Devices*, Wiley, New York, 1969, p. 43, while the curves for sweep-out voltage were derived by using equation (5) above.

Isolation η is defined as maximum attenuation. For high attenuation, the +1 and $B/2Y_o$ of equation (3) may be neglected. When a switch is made up of three devices spaced ¼ wavelength apart, the isolation is given by $$\eta = 12 + 60 \log\left[\frac{G}{2Y_o}\right]. \quad (8)$$

Combining equations (4), (6) and (8) provides $$\eta = 4.5 + 60 \log Q_{BW} \quad (9)$$

where $$Q_{BW} = 2\pi f'_c/\Delta w. \quad (10).$$

As an example of the application of the curves of FIG. 4, a three-element switch operating up to 20 GHz and providing more than 60 dB of isolation requires a Q=10 to satisfy the isolation. The required $f'_c = 200$ GHz is provided by n-type GaAs at $1.6 \times 10^{16}$ doping in accordance with FIG. 2, and 25 V sweeps out 1.4 μm.

The present controlled device provides fast switching speed and requires low current for modulation power. The peak RF voltage at which the FET begins to limit corresponds to the applied gate voltage; 25 V in a 50-ohm transmission line gives 6.25 W. Charge motion dynamics in the depletion region may make the limit level higher.

I wish it to be understood that I do not desire to be limited to the exact details of construction shown and described, for obvious modifications can be made by a person skilled in the art.

I claim:

1. A microwave switching device comprising:
   a first layer of a substantially intrinsic semiconductor material approximately 1 um thick;
   a second layer of a doped semiconductor material formed on a surface of said first layer;
   a control terminal which is formed on a surface of said layer;
   a first controlled terminal and a second controlled terminal which are formed on said surface of said second layer and are disposed equidistance from the control terminal on respective opposite sides of the control terminal, said first controlled terminal and said second controlled terminal having respective massive surface areas in the range of $60-500\times 10^{<9}$ m² to minimize parasitic inductance in said device, each controlled terminal being substantially grounded and having a sloping face facing said control terminal to provide progressively increasing separation between said control terminal and said controlled terminal with increasing distance from said second layer; and
   a thin layer of insulator material covering said sloping faces and said surface of said second layer between said control terminal and said controlled terminals;
   wherein said second layer includes an active region approximately 3 um long substantially centered under said control terminal and extending to opposite portions of said doped semiconductor underlying said first and second controlled terminals, and said control terminal is connected to a source of control voltage providing a potential for depleting said active region of majority carriers.

2. A microwave switching device as recited in claim 1 wherein said second layer of doped semiconductor is doped with an impurity providing N-type majority carriers and said portion thereof has a low resistance.

3. A microwave switching device as recited in claim 1 wherein said substantially intrinsic semiconductor comprises intrinsic GaAs.

4. A plurality of microwave switching devices as recited in claim 1 spaced apart by distances of one quarter wavelength of the operating frequency.

5. A plurality of microwave switching devices as recited in claim 1 forming second, fourth and sixth elements of a Chebyshev filter.

6. A microwave switching device as recited in claim 1 wherein said controlled terminals are connected in series with a center conductor of a transmission line.

7. A microwave switching device as recited in claim 1 wherein said controlled terminals are connected in shunt between a center conductor and an outer conductor of a transmission line.

8. A microwave switching device as recited in claim 1 wherein said controlled terminals are connected in shunt with a waveguide at a maximum point of the electric field therein.

* * * * *